(12) United States Patent
Sugino et al.

(10) Patent No.: US 11,945,332 B2
(45) Date of Patent: Apr. 2, 2024

(54) DISPLAY SYSTEM AND VEHICLE INCLUDING THE SAME, AND METHOD OF DISPLAY OF STATUS OF SECONDARY BATTERY

(71) Applicant: TOYOTA JIDOSHA KABUSHIKI KAISHA, Toyota (JP)

(72) Inventors: Yoshiki Sugino, Seto (JP); Yoshihiro Uchida, Nagakute (JP); Nobuyuki Tanaka, Toyota (JP); Junta Izumi, Nagoya (JP); Kazuki Kubo, Toyota (JP)

(73) Assignee: TOYOTA JIDOSHA KABUSHIKI KAISHA, Toyota (JP)

( * ) Notice: Subject to any disclaimer, the term of this patent is extended or adjusted under 35 U.S.C. 154(b) by 346 days.

(21) Appl. No.: 16/933,390

(22) Filed: Jul. 20, 2020

(65) Prior Publication Data

US 2021/0061127 A1 Mar. 4, 2021

(30) Foreign Application Priority Data

Aug. 30, 2019 (JP) .................................. 2019-158632

(51) Int. Cl.
*B60L 58/12* (2019.01)
*B60L 58/16* (2019.01)
*G01R 31/36* (2020.01)
*H02J 7/00* (2006.01)

(52) U.S. Cl.
CPC .............. *B60L 58/12* (2019.02); *B60L 58/16* (2019.02); *G01R 31/3648* (2013.01); *H02J 7/0048* (2020.01); *B60L 2250/16* (2013.01)

(58) Field of Classification Search
CPC combination set(s) only.
See application file for complete search history.

(56) References Cited

U.S. PATENT DOCUMENTS

| | | | |
|---|---|---|---|
| 9,114,709 B2* | 8/2015 | Stanek | H02J 7/342 |
| 9,267,994 B2 | 2/2016 | Plestid | |
| 10,351,009 B2* | 7/2019 | Miller | G01C 21/36 |
| 2005/0128065 A1* | 6/2005 | Kolpasky | G09F 21/04 |
| | | | 340/461 |
| 2010/0010707 A1* | 1/2010 | Izumi | G01R 31/3835 |
| | | | 701/33.7 |
| 2012/0179319 A1* | 7/2012 | Gilman | B60W 50/14 |
| | | | 340/455 |

(Continued)

FOREIGN PATENT DOCUMENTS

| | | | | |
|---|---|---|---|---|
| CN | 103797452 A | * | 5/2014 | ........... G06F 1/3212 |
| DE | 102005026583 A1 | | 12/2006 | |

(Continued)

*Primary Examiner* — Peter D Nolan
*Assistant Examiner* — Anwar Mohamed
(74) *Attorney, Agent, or Firm* — Sughrue Mion, PLLC

(57) ABSTRACT

A vehicle includes: an instrument panel; and an ECU that controls the instrument panel so that the instrument panel displays an icon representing a status of a battery. The icon represents one of a first indication and a second indication by an increase or decrease of a scale in a display region of the icon, and the other one of the first indication and the second indication by an amount indicated by a size of a display area of the icon, the first indication representing SOC of the battery, the second indication representing a full charge capacity of the battery.

5 Claims, 4 Drawing Sheets

(56) References Cited

U.S. PATENT DOCUMENTS

| | | | |
|---|---|---|---|
| 2013/0076366 A1 | 3/2013 | Arizono et al. | |
| 2013/0271285 A1* | 10/2013 | Sako | B60L 58/12 340/636.1 |
| 2014/0104082 A1* | 4/2014 | Nakamura | G06F 1/3265 340/995.15 |
| 2015/0338469 A1* | 11/2015 | Lee | G06F 11/324 324/427 |
| 2016/0109931 A1* | 4/2016 | Kobayashi | G02B 27/017 345/212 |
| 2016/0267847 A1* | 9/2016 | Chen | G09G 3/3225 |
| 2020/0122577 A1* | 4/2020 | Kubo | B60K 35/00 |
| 2020/0135152 A1* | 4/2020 | Foster | G09G 5/02 |
| 2020/0398666 A1* | 12/2020 | Higuchi | B60W 50/14 |
| 2020/0398816 A1* | 12/2020 | Higuchi | B60W 20/17 |
| 2021/0066765 A1* | 3/2021 | Tanaka | G01R 31/382 |

FOREIGN PATENT DOCUMENTS

| | | | |
|---|---|---|---|
| JP | 2007-93358 A | | 4/2007 |
| JP | 2011-257213 A | | 12/2011 |
| JP | 2012-73175 A | | 4/2012 |
| JP | 2012073175 A | * | 4/2012 |
| JP | 2013-032132 A | | 2/2013 |
| WO | 2013/157297 A1 | | 10/2013 |

* cited by examiner (R1 > R2 > R3)

DISPLAY SYSTEM AND VEHICLE INCLUDING THE SAME, AND METHOD OF DISPLAY OF STATUS OF SECONDARY BATTERY

This nonprovisional application is based on Japanese Patent Application No. 2019-158632 filed on Aug. 30, 2019 with the Japan Patent Office, the entire content of which is hereby incorporated by reference.

BACKGROUND

Field

The present disclosure relates to a display system and a vehicle including the same, and a method of display of a status of a secondary battery.

Description of the Background Art

State of charge (SOC) is widely used as an indication representing an amount of battery remained (remaining capacity) in a secondary battery. The secondary battery deteriorates with use, and the full charge capacity of the secondary battery decreases. The SOC and the full charge capacity of the secondary battery are important indications for a user. However, in a general electronic device, SOC and the full charge capacity of the secondary battery are less likely to be displayed simultaneously on the same screen of a display. For example, while the amount of battery remained is always displayed on many smartphones, it requires a specific operation to display the full charge capacity.

In contrast, if SOC and the full charge capacity of a secondary battery carried in a vehicle (the electric vehicle, etc.) decrease, EV travel distance (a distance the vehicle can travel with the power stored in the secondary battery) of the vehicle may excessively decrease. Thus, it is contemplated to display both SOC and the full charge capacity in the vehicle to remedy the user's concerns. For example, Japanese Patent Laying-Open No. 2011-257213 discloses a battery display device which displays both SOC and the full charge capacity of a battery (see FIG. 3 of Japanese Patent Laying-Open No. 2011-257213).

SUMMARY

When SOC and the full charge capacity of the secondary battery are simultaneously displayed on the same screen, the user may not be able to intuitively grasp the display content, such as the user being confused between the SOC and the full charge capacity. Accordingly, it is desirable to display SOC and the full charge capacity of the secondary battery in an easy-to-understand manner.

(1) A display system according to a certain aspect of the present disclosure includes: a display; and a controller that controls the display so that the display displays an icon representing a status of a secondary battery. The icon represents one of a first indication and a second indication by an increase or decrease of a scale in a display region of the icon, and represents the other one of the first indication and the second indication by an amount indicated by a size of (variations in) a display area of the icon, the first indication representing an amount of battery remained in the secondary battery, the second indication representing a full charge capacity of the secondary battery.

(2) The icon represents the first indication by the increase or decrease of the scale, and the second indication by the amount indicated by the size of the display area of the icon. The scale decreases with a decrease of the first indication. The display area of the icon decreases with a decrease of the second indication.

In the above configurations (1) and (2), the first indication and the second indication are represented by different features of the icon (an increase or decrease of the scale/the size of the display area of the icon). For this reason, as compared to representing the first indication and the second indication by a common feature (e.g., displaying the two in scales), the user is allowed to readily distinguish between the first indication and the second indication, thereby preventing the user from being confused between the two. Thus, according to the configurations (1) and (2), SOC and the full charge capacity of the secondary battery can be displayed in an easy-to-understand manner.

(3) The scale increases and decreases in a predetermined direction. The display area of the icon varies by the icon changing in shape in a direction perpendicular to the predetermined direction.

According to the above configuration (3), if the direction of increase or decrease of the scale of the icon and the direction in which the icon display area varies are the same direction (e.g., both in the vertical direction), the user may misunderstand the reduction of the icon display area as the reduction of the scale. These two are in different directions that are perpendicular to each other, thereby allowing a reduced likelihood of the misjudgemenet.

(4) The shape of the icon varies in the direction perpendicular to the predetermined direction, while keeping an aspect ratio of the icon.

According to the above configuration (4), since the shape of the icon varies enlarges/reduces) while keeping the aspect ratio of the icon, the user is allowed to easily recognize the icon, and SOC and the full charge capacity of the secondary battery can be displayed in an easier-to-understand manner.

(5) The icon has a shape which is a profile shape of a battery case. The increase or decrease of the scale is displayed in a segment display.

According to the above configuration (5), an icon having a battery shape is employed to represent the status of the secondary battery, and a segment display, which is familiar to many users, is employed, thereby allowing SOC and the full charge capacity of the secondary battery to be displayed in an easier-to-understand manner.

(6) A vehicle according to another aspect of the present disclosure includes: the secondary battery; and the display system.

According to the above configuration (6), easy-to-understand display of the SOC and the full charge capacity of the secondary battery can be implemented in the vehicle.

(7) A method of display of a status of a secondary battery according to still another aspect of the present disclosure displays a status of the secondary battery. The method includes: obtaining a first indication representing an amount of battery remained in the secondary battery; obtaining a second indication representing a full charge capacity of the secondary battery; and displaying an icon representing the status of the secondary battery on a display. The icon represents one of the first indication and the second indication by an increase or decrease of a scale in a display region of the icon, and the other one of the first indication and the second indication by an amount indicated by a size of a display area of the icon.

Similarly to the above configuration (1), according to the above method (7), SOC and the full charge capacity of the secondary battery can be displayed in an easy-to-understand manner.

The foregoing and other objects, features, aspects and advantages of the present disclosure will become more apparent from the following detailed description of the present disclosure when taken in conjunction with the accompanying drawings.

DESCRIPTION OF THE PREFERRED EMBODIMENTS

Hereinafter, the present embodiment will be described, with reference to the accompanying drawings. Note that the same reference signs are used to refer to the same or like parts, and the description will not be repeated.

Embodiment

<Overall Configuration of System>

Figure 1:
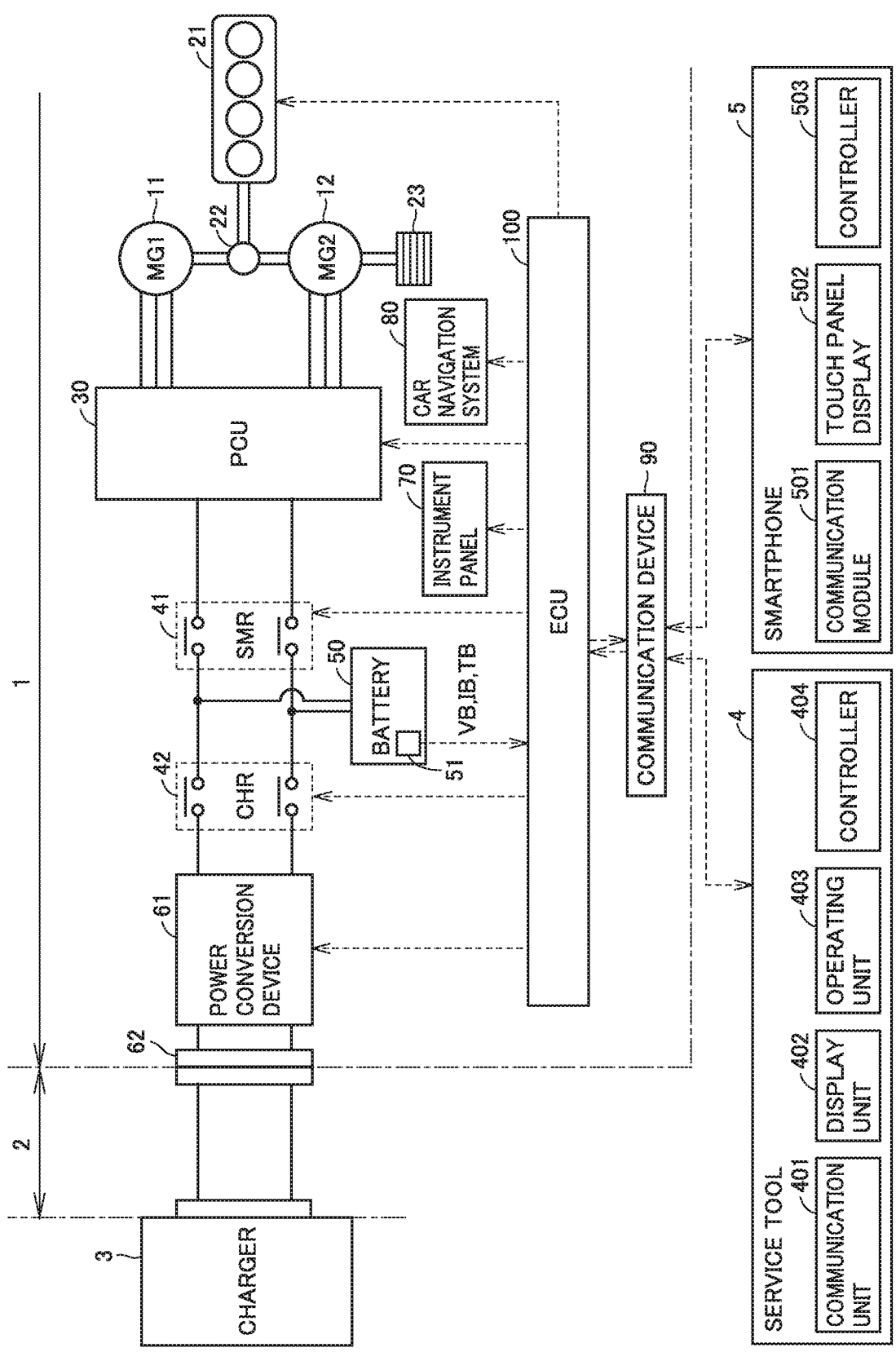
FIG. 1 is a diagram schematically showing an overall configuration of a system, including a vehicle according to the present disclosure.

FIG. 1 is a diagram schematically showing an overall configuration of a system, including a vehicle according to an embodiment of the present disclosure. Referring to FIG. 1, a vehicle 1 is, for example, a plug-in hybrid vehicle, and capable of electrically connecting to a charger 3 through a charging cable 2. Vehicle 1 may be any vehicle carrying a secondary battery as a drive source, or a typical hybrid vehicle that is not capable of plug-in charging. Vehicle 1 may also be an electric vehicle or a fuel cell vehicle.

Vehicle 1 includes motor generators 11 and 12, an engine 21, a power split device 22, driving wheels 23, a power control unit (PCU) 30, a system main relay (SMR) 41, a charge relay 42, a battery 50, a power conversion device 61, an inlet 62, an instrument panel 70, a car navigation system 80, a communication device 90, and an electronic control unit (ECU) 100.

For example, motor generators 11 and 12 are each a three-phase AC rotating electric machine which includes a rotor (not shown) having a permanent-magnet embedded therein. Motor generator 11 is coupled to the crankshaft of engine 21 via power split device 22. Motor generator 11 uses the power from battery 50 to rotate the crankshaft of engine 21 to start engine 21. Motor generator 11 can also generate power using the mechanical power of engine 21. Alternate-current (AC) power generated by motor generator 11 is converted into direct-current (DC) power by PCU 30 and stored into battery 50. The AC power generated by motor generator 11 may also be supplied to motor generator 12.

Motor generator 12 uses at least one of the power from battery 50 and the power generated by motor generator 11 to rotate the drive shaft. Motor generator 12 is also capable of generating power by regenerative braking. The AC power generated by motor generator 12 is converted into DC power by PCU 30 and stored into battery 50.

Engine 21 is an internal combustion engine for a gasoline engine, a diesel engine, etc. and generates mechanical power in response to a control signal from ECU 100, the mechanical power being power for allowing vehicle 1 to travel. Power split device 22 is, for example, a planetary gear mechanism. Power split device 22 divides the mechanical power generated by engine 21 into mechanical power to be transmitted to driving wheels 23 and mechanical power to be transmitted to motor generator 11.

In response to the control signal from ECU 100, PCU 30 converts the DC power stored in battery 50 into AC power and supplies the AC power to motor generators 11 and 12. PCU 30 also converts the AC power generated by motor generators 11 and 12 into DC power and supplies the DC power to battery 50.

SMR 41 is electrically connected to a power line connecting PCU 30 and battery 50. SMR 41 switches between supply and shutting off of power between PCU 30 and battery 50, in response to a control signal from ECU 100.

Charge relay 42 is electrically connected to a power line connecting battery 50 and power conversion device 61. Charge relay 42 switches between supply and shutting off of power between battery 50 and power conversion device 61, in response to a control signal from ECU 100.

Battery 50 is a DC power supply capable of charging and discharging power. A secondary battery, such as a lithium-ion secondary battery or a nickel-hydrogen battery, may be used as battery 50. Battery 50 supplies PCU 30 with power for generating the driving force for vehicle 1. Battery 50 also stores the power generated by motor generator 11.

Battery 50 includes a monitoring unit 51 for monitoring the status of battery 50. Monitoring unit 51 includes a voltage sensor for detecting a voltage VB of battery 50, and a current sensor for detecting a current IB input to/output from battery 50, and a temperature sensor for detecting a temperature TB of battery 50 (none of which are shown). Each sensor outputs a signal indicative of a result of the detection by the sensor to ECU 100. Based on the results of the detections by the voltage sensor and the current sensor, ECU 100 is capable of, for example, calculating SOC of battery 50, and calculating the full charge capacity of battery 50.

Power conversion device 61 includes, for example, an AC/DC converter (not shown). Power conversion device 61 converts the AC power supplied from charger 3 via charging cable 2 and inlet 62 into DC power and outputs the DC power to charge relay 42.

Instrument panel 70 is a dashboard in which meters are installed, and displays various statuses of vehicle 1, according to control by ECU 100. More specifically, instrument panel 70 displays the speedometer, the tachometer, the fuel gauge, the water temperature gauge, the tripmeter, and idiot lights, and also displays the statuses of battery 50 (SOC and the full charge capacity).

Car navigation system 80 includes a global positioning system (GPS) receiver for locating the vehicle 1 based on a radio wave from an artificial satellite, and a touch panel monitor for receiving user operations and displaying various information (none of which are shown).

Communication device 90 is capable of wired or wireless two-way communications with a service tool 4. Communication device 90 is also capable of the two-way communications with the user's smartphone 5.

ECU 100 includes a central processing unit (CPU), a memory, and input/output ports (none of which are shown). ECU 100 may be divided into multiple ECUs by function. ECU 100 outputs a control signal, based on input of a signal from each sensor and maps and programs stored in the memory, and controls each device so that vehicle 1 is brought into a desired state. In the present embodiment, the main control that is performed by ECU 100 includes a "battery display process" in which SOC and the full charge capacity of battery 50 are calculated and indications regarding of the SOC and the full charge capacity are displayed on instrument panel 70. The battery display process will be described below in detail.

Service tool 4 is a dedicated terminal installed in a car dealer, auto repair shop, etc., and diagnoses the presence or absence of abnormality of vehicle 1 (including the status of battery 50). More specifically, service tool 4 includes a communication unit 401, a display unit 402, an operating unit 403, and a controller 404. Controller 404 performs necessary communications with vehicle 1 via communication unit 401, according to an operator's operation of operating unit 403, thereby diagnosing the presence or absence of abnormality of vehicle 1 and displays diagnostic results on display unit 402.

Smartphone 5 includes a communication module 501, a touch panel display 502, and a controller 503. Through communications with vehicle 1 via communication module 501, controller 503 can display various information about vehicle 1 on touch panel display 502, receive user operations on touch panel display 502, etc.

Note that instrument panel 70 corresponds to a "display" according to the present disclosure. The "display" according to the present disclosure is not limited to instrument panel 70, and may be car navigation system 80, service tool 4, or smartphone 5. ECU 100 included in vehicle 1, controller 404 included in service tool 4, and controller 503 included in smartphone 5 each correspond to a "controller" according to the present disclosure.

<Battery Display Process>

When SOC and the full charge capacity (a capacity retention Q in an example below) of battery 50 are displayed on instrument panel 70 in the battery display process, the user may not be able to intuitively grasp the display content, such as the user being confused between the SOC and the full charge capacity. Accordingly, it is desirable to display SOC and the full charge capacity of battery 50 in an easy-to-understand manner.

Thus, in the present embodiment, SOC of battery 50 is represented by a segment display in a single icon displayed on instrument panel 70, and full charge capacity FCC of battery 50 is represented in terms of a display area of the icon. Hereinafter, details of this representation aspect will be described, with reference to a flowchart of FIG. 2. While the flowchart illustrates an example in which an icon representing the status of battery 50 is displayed on instrument panel 70, it should be noted that the icon can be displayed on other displays (car navigation system 80, service tool 4, or smartphone 5) as well.

<Process Flow>

Figure 2:
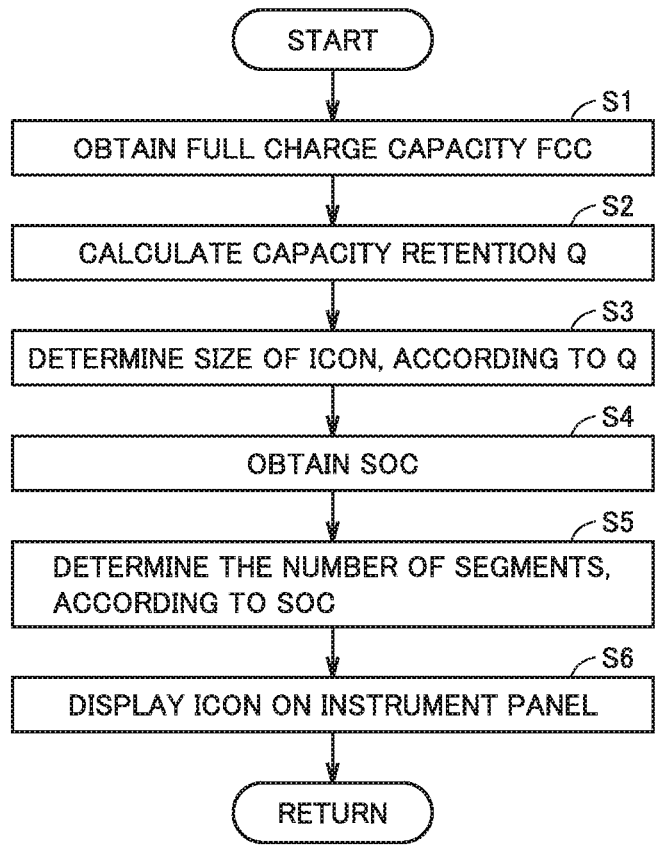
FIG. 2 is a flowchart illustrating a battery display process according to the embodiment.

FIG. 2 is a flowchart illustrating a battery display process according to the present embodiment. The flowchart is performed by ECU 100 for each predetermined control cycle, for example. Each step included in the flowchart, while it is implemented basically by software processing by ECU 100, may be implemented by dedicated hardware (electric circuits) fabricated within ECU 100. Note that, in the following, step will be abbreviated as "S."

Referring to FIG. 2, in S1, ECU 100 obtains full charge capacity FCC of battery 50. ECU 100 can calculate full charge capacity FCC of battery 50, for example, during the plug-in charging of vehicle 1, store full charge capacity FCC in a memory (not shown), and read the value of full charge capacity FCC.

A well-known approach can be employed as the calculation approach of full charge capacity FCC. For example, ECU 100 calculates SOC of battery 50 upon initiation of plug-in charging. This SOC will be called "initial SOC," and described as S1. Then, ECU 100 calculates an amount of power ΔAh charged in and discharged from battery 50 since the estimated time of the initial SOC. The amount of power ΔAh can be calculated by integrating the value of current flow through battery 50, using the current sensor included in monitoring unit 51. ECU 100 then calculates SOC of battery 50 again. This SOC will be called "final SOC" and described as S2. In that case, ECU 100 can calculate full charge capacity FCC of battery 50, according to Equation (1) below.

$$FCC=\Delta Ah/|S1-S2|*100 \qquad (1)$$

In S2, ECU 100 calculates capacity retention Q of battery 50. Capacity retention Q of battery 50 refers to a percentage [unit: %] of full charge capacity FCC of battery 50 at the current time over full charge capacity FCC0 of battery 50 in the initial status. Capacity retention Q is calculated by Equation (2) below. Note that initial value FCC0 of the full charge capacity may be the full charge capacity measured during manufacturing of battery 50 (or vehicle 1), or a specification value (catalog value) of the full charge capacity of battery 50.

$$Q=FCC/FCC0*100 \qquad (2)$$

However, the following process can be performed using full charge capacity FCC, without requiring conversion of full charge capacity FCC into capacity retention Q. Alternatively, the EV travel range retention of vehicle 1 may be used, instead of full charge capacity FCC or capacity retention Q of battery 50. The EV travel range retention refers to a percentage [unit: %] of the EV travel range of vehicle 1 at the current time over the EV travel range of vehicle 1 in the initial status. The EV travel range is calculated by multiplying the full charge capacity of battery 50 by the power consumption efficiency of vehicle 1 (power consumption per unit of distance traveled). The EV travel range is proportional to the full charge capacity, and thus the EV travel range retention indicates the same value as that of the capacity retention Q. Note that full charge capacity FCC, capacity retention Q, and the EV travel range retention each correspond to a "second indication" according to the present disclosure.

In S3, ECU 100 determines a size of the icon (the display area of the icon), according to capacity retention Q calculated in S2.

Figure 3:
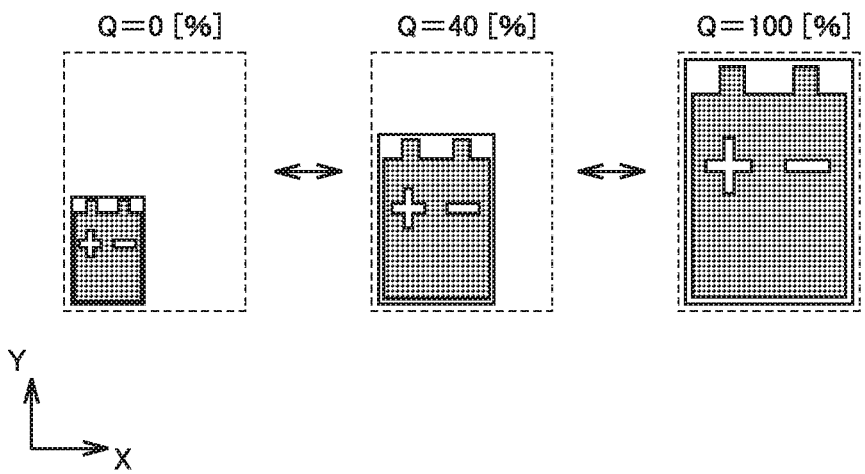
FIG. 3 is a diagram for illustrating an icon size determination approach.

FIG. 3 is a diagram for illustrating an icon size determination approach. Referring to FIG. 3, in the present embodiment, the status of battery 50 is displayed by an icon which is an abstraction of the shape of a case of a typical battery cell (such as a dry battery).

The size of the icon display area represents capacity retention Q of battery 50. In the example shown in FIG. 3, the shapes of the icons are the same, irrespective of capacity retention Q of battery 50, and the icons are mutually congruent. Stated differently, the display area of the icon varies horizontally (X direction) and vertically (Y direction), while keeping a ratio of the height and the width (aspect ratio) of the icon. Note that for comparison, the display size of the icon when capacity retention Q of battery 50 is 100% is indicated by the dashed lines.

The higher the capacity retention Q of battery 50, the larger the display area of the icon. The display area of the icon when capacity retention Q is 0% is a predetermined minimum area Amin. When capacity retention. Q is 100%, the display area of the icon is a predetermined maximum area Amax. When capacity retention Q is above 0% and less than 100% (Q=40% in this example), the display area of the icon is determined so as to be proportional to capacity retention Q between minimum area Amin and maximum area Amax.

Returning to FIG. 2, in S4, ECU 100 obtains the current SOC of battery 50. ECU 100 then determines the number of segments displayed in the display region of the icon, according to the SOC obtained in S4 (S5).

Figure 4:
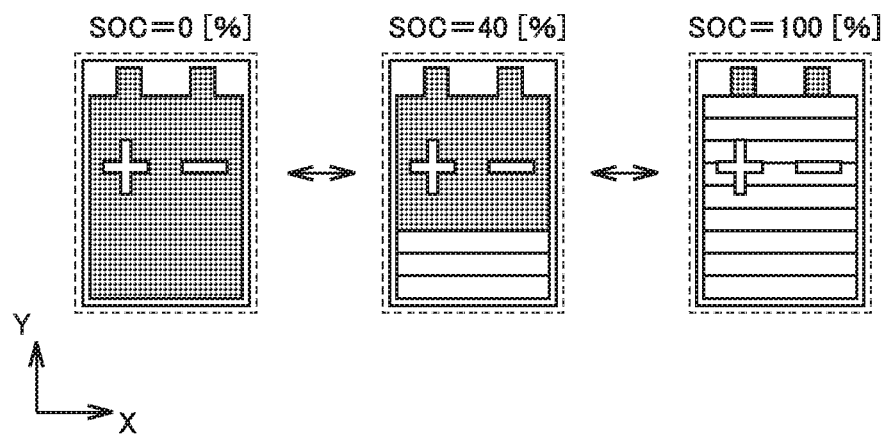
FIG. 4 is a diagram for illustrating an approach for determining the number of segments displayed in an icon.

FIG. 4 is a diagram for illustrating an approach for determining the number of segments displayed in the icon. Referring to FIG. 4, the number of segments displayed in the icon represents SOC of battery 50. In the example shown in FIG. 4, the number of segments in the icon increases or decreases vertically (Y direction) with variations in SOC of battery 50.

The higher the SOC of battery 50, the more the number of segments displayed. When SOC is 0%, the number of segments is a predetermined minimum number Nmin (zero in this example). When SOC is 100%, the number of segments is a predetermined maximum number Nmax (nine in this example). When SOC is above 0% and less than 100% (Q=40% in this example), the number of segments is determined so as to be proportional to SOC between minimum number Nmin and maximum number Nmax.

Referring again to FIG. 2, in S6, ECU 100 displays the icon on instrument panel 70 having the display area determined in S3 and the number of segments determined in S4.

Figure 5:
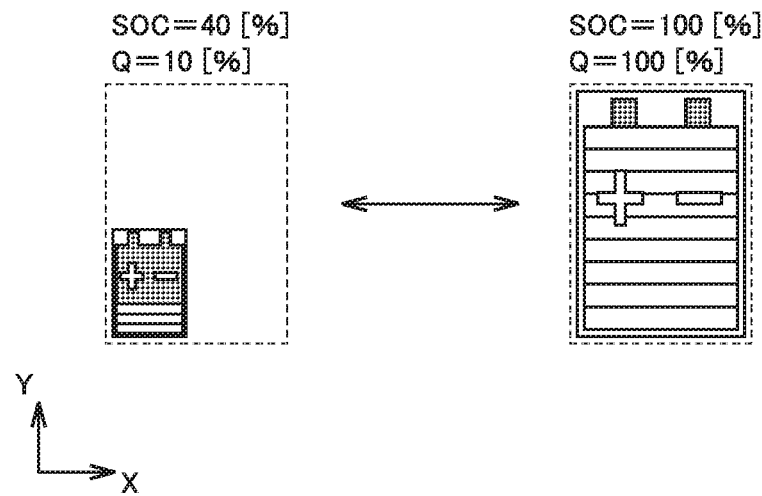
FIG. 5 is a diagram showing one example icon displayed on an instrument panel.

FIG. 5 is a diagram showing one example icon displayed on instrument panel 70. For example, when SOC of battery 50 is 100% and capacity retention Q of battery 50 is 100%, an icon as shown on the right hand side of the figure is displayed on instrument panel 70. In contrast, when battery 50 has deteriorated wherein SOC of battery 50 has decreased to 40% and capacity retention Q of battery 50 has decreased to 10%, an icon as shown on the left hand side of the figure is displayed on instrument panel 70.

As described above, in the present embodiment, both SOC and capacity retention Q of battery 50 are simultaneously displayed by a single icon. In the icon display mode according to the present embodiment, SOC and capacity retention Q of battery 50 are represented by different features (the number of segments/icon size) of the icon. Therefore, as compared to representing SOC and capacity retention Q by a common feature, such as SOC and capacity retention Q of battery 50 being displayed in segment display (e.g., see Japanese Patent Laying-Open No. 2011-257213), the user is allowed to readily distinguish between SOC and capacity retention Q of battery 50, preventing the user from being confused between the two. Thus, according to the present embodiment, SOC and the full charge capacity of battery 50 can be displayed in an easy-to-understand manner.

Generally, as the battery is deteriorated and the capacity retention decreases, the amount of power that can be charged in the battery decreases. In this respect, the capacity retention is an indication that represents the size of a "container" storing the power. In the present embodiment, capacity retention Q of battery 50 is represented in terms of the size of the display area of the icon (icon size). The icon size decreases with a reduction of capacity retention Q of battery 50, that is, reduction in size of the "container." This allows the user to intuitively understand that the full charge capacity of battery 50 is decreasing.

It can also be contemplated to vary, while keeping the icon size constant, irrespective of capacity retention Q of battery 50, the gradation of the area of the icon as a function of the amount of the reduction of capacity retention Q (what is called grayout). However, depending on the user, he/she cannot instantly understand the grayout as representing the reduction of capacity retention Q, and can misinterpret the grayed out region as representing the reduction of SOC of battery 50. Alternatively, the user may be required to consciously ascertain that the greyout means reduction of capacity retention Q and the reduction in the number of segments means reduction of SOC (not the other way around). According to the present embodiment, matching the variations in size of the "container" and the variations in icon size allows the user to readily, intuitively understand that capacity retention Q of battery 50 is decreasing.

However, the approach for displaying SOC of battery 50 and the approach for displaying capacity retention Q of battery 50 may be exchanged. In other words, capacity retention Q of battery 50 can be represented by segment display and SOC of battery 50 can be represented in terms of icon size.

Moreover, as described with respect to FIGS. 3 and 4, the number of segments within the icon increases or decreases vertically, while the display area of the icon varies horizontally (although it varies vertically as well). In other words, in the present embodiment, the direction of the increase or decrease of the number of segments of the icon is perpendicular to the direction of variation in icon display area. If the direction of variation in the number of segments of the icon and the direction of variation in icon display area are the same direction (e.g., both vary vertically), the user may misjudge the reduction of the icon display area as the reduction of the number of segments. The likelihood of such a misjudgement can be reduced by varying the number of segments of the icon and the icon display area in different directions perpendicular to each other.

Furthermore, as shown in FIG. 4, since the shape of the icon enlarges/reduces while keeping the aspect ratio of the icon, the user can readily recognize the icon. Accordingly, SOC and capacity retention Q of battery 50 can be displayed in an easier-to-understand manner.

Note that the segment display is one example of "display by increase or decrease of a scale" according to the present disclosure. The "scale indication" is not limited to the segment display, and can include, for example, a meter indication. In other words, one of SOC and capacity retention Q of battery 50 may be indicated by a value indicated by the analog hand.

In the example described with reference to FIG. 3, the icon enlarges/reduces in size as a function of capacity retention Q of battery 50, while keeping the aspect ratio of the icon. However, it is not necessarily required to keep the aspect ratio of the icon when varying the icon size.

Figure 6:
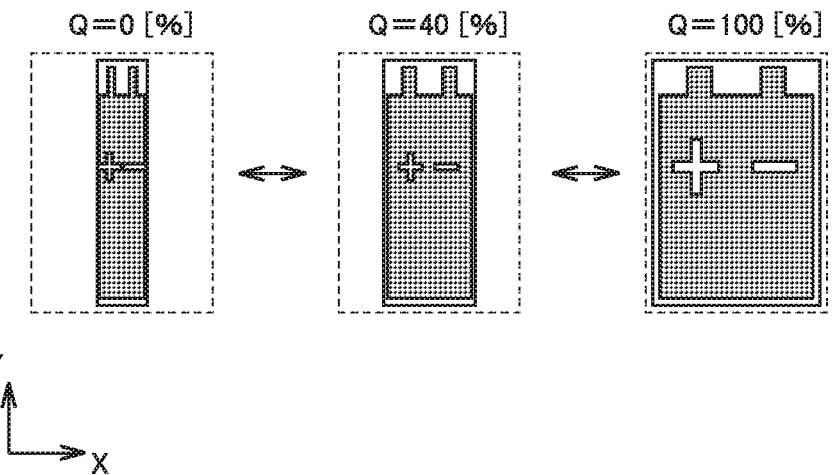
FIG. 6 is a diagram for illustrating another display mode of the icon size.

FIG. 6 is a diagram for illustrating another display mode of the icon size. Referring to FIG. 6, in this example, the length of the icon is varied in the horizontal direction (Y direction) perpendicular to the direction (X direction) in which the number of segments is varied, while keeping the length of the icon in the longitudinal direction which is the direction in which the number of segments is varied. Such a display, mode can also reduce the likelihood of a misjudgement.

As the full charge capacity of battery 50 decreases, the number of segments in the icon decreases quickly even though the amount of power same as before the reduction of the full charge capacity of battery 50 is charged or discharged. However, the user may question why the rate of decrease of the number of segments in the icon has increased, without noticing the reduction of the full charge capacity. In the display mode shown in FIG. 6, the number of segments increases or decreases vertically, while the icon size varies only horizontally (the width direction of the icon). In other words, the direction in Which the number of segments increases or decreases and the direction in which the icon size varies are in isolation completely from each other. This allows the user to more readily understand the reduction of the full charge capacity of battery 50 from the narrowed width of the icon, and even more readily understand an increased rate of increase or decrease in the number of segments with a reduction of the full charge capacity. Thus, the likelihood the user have a question as the above can be reduced.

[Variation 1]

While the embodiment has been described, with reference to using an icon which is an abstraction of the shape of a case of the battery. However, the type of the icon is not limited thereto.

Figure 7:
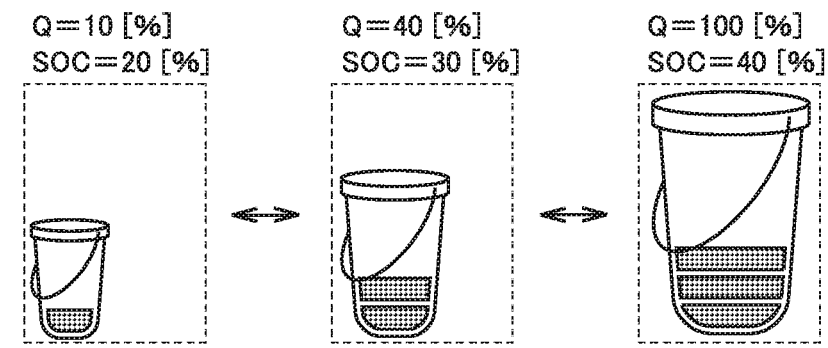
FIG. 7 is a diagram showing another example icon displayed on the instrument panel.

FIG. 7 is a diagram showing another example icon displayed on instrument panel 70. Referring to FIG. 7, Variation 1 employs an icon having the shape of a bucket, and the amount of power stored in battery 50 is compared to water. SOC of battery 50 is represented in terms of an amount of water in the bucket, and the full charge capacity of battery 50 is represented in terms of a size of the bucket. Since people pour water into and out of the bucket in daily life, the analogy above is easy to understand even for a user who is not familiar with batteries. Similarly to the embodiment, SOC and the full charge capacity of battery 50 can be displayed in an easy-to-understand manner, even according to Variation 1.

[Variation 2]

The present embodiment and Variation 1 thereof have been described with reference to displaying SOC and the full charge capacity of battery 50. In Variation 2, the state of health (SOH) (i.e., the state of deterioration) of battery 50 is displayed, in addition to SOC and the full charge capacity of battery 50. In general, the internal resistance of the battery increases as which deterioration of the battery. SOH of battery 50 according to Variation 2 described below is, specifically, the internal resistance of battery 50.

Figure 8:
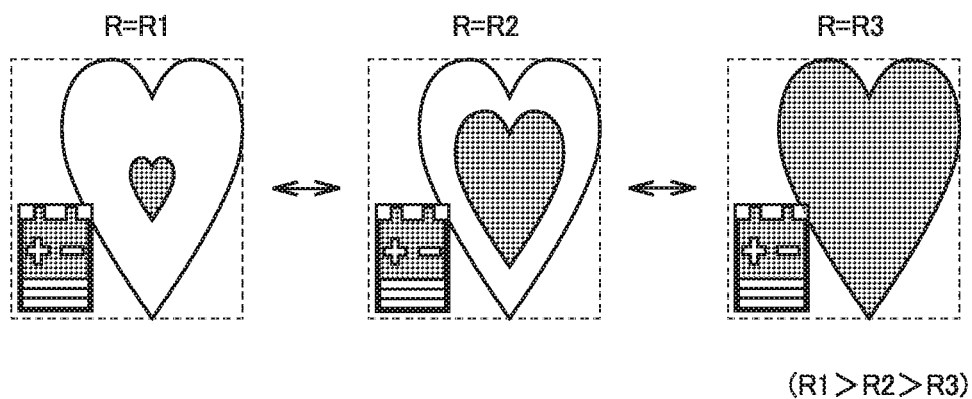
FIG. 8 is a diagram showing one example icon which further displays SOH of a battery.

FIG. 8 is a diagram showing one example icon for further displaying SOH of battery 50. Referring to FIG. 8, in Variation 1, a heart icon is employed which represents internal resistance R of battery 50. The lower the internal resistance R of battery 50, the larger the display area of the heart icon. As battery 50 deteriorates and internal resistance R increases, the display area of the heart icon decreases.

As such, SOH of battery 50 may be additionally displayed, together with SOC and the full charge capacity of battery 50. SOH of battery 50 can affect charge or discharge performance of battery 50 (hence, driving performance of vehicle 1). SOH of battery 50 can also affect the sales price of vehicle 1. Accordingly, SOH of battery 50 is the user's interest. Thus, user convenience can be improved by displaying SOH of battery 50 as well in an easy-to-understand manner to the user.

Note that SOH of battery 50 is not limited to internal resistance R of battery 50. SOH of battery 50 may be a parameter (the lifetime of battery 50, so to speak) which is calculated based on full charge capacity FCC and internal resistance R of battery 50. For example, full charge capacity FCC and internal resistance R of battery 50 are weighed appropriately and the status of battery 50 is scored so that the status of battery 50 has a perfect score (e.g., FCC: 60 points+R: 40 points=a total of 100 points) when full charge capacity FCC and internal resistance R are both at a highest value (the initial value of battery 50), and the status of battery 50 has zero point (FCC: zero point+R: zero point=a total of zero point) when full charge capacity FCC and internal resistance R are at a lowest value (the manufacturer's a certified value for deteriorated battery 50).

Although the present disclosure has been described and illustrated in detail, it is clearly understood that the same is by way of illustration and example only and is not to be taken by way of limitation, the scope of the present disclosure being interpreted by the terms of the appended claims.

What is claimed is:

1. A display system, comprising:
   a display configured to display an icon that represents a status of a secondary battery; and
   a controller configured to control the display of the icon, wherein
   the icon is configured to simultaneously:
   display a first indication that represents a state of charge (SOC) of the secondary battery, wherein the first indication includes a plurality of segments in the icon, so that as the SOC of the secondary battery becomes lower, a fewer number of the plurality of segments are displayed in the icon;
   display a second indication that represents a full charge capacity of the secondary battery, wherein as the full charge capacity of the rechargeable battery decreases, a size of the icon becomes smaller on the display; and
   wherein the controller is configured to simultaneously display an additional icon separately from the icon, wherein a third indication that represents a state of health (SOH) of the secondary battery is displayed by the additional icon, and a size of the additional icon becomes smaller as the SOH decreases.

2. The display system according to claim 1, wherein an aspect ratio of the icon is maintained when the size of the icon changes.

3. The display system according to claim 1, wherein the icon has a shape comprising a profile shape of a battery case.

4. A vehicle, comprising:
   the secondary battery; and
   the display system according to claim 1.

5. A method for displaying a status of a secondary battery, the method comprising:
   obtaining a first indication representing a state of charge (SOC) of the secondary battery;
   obtaining a second indication representing a full charge capacity of the secondary battery;
   displaying an icon representing the status of the secondary battery on a display, wherein
   the icon represents: (i) the first indication, which includes a plurality of segments in the icon, so that as the SOC of the secondary battery becomes lower, a fewer number of the plurality of segments are displayed in the icon, and (ii) the second indication, wherein as the full charge capacity of the rechargeable battery decreases, a size of the icon becomes smaller on the display; and
displaying an additional icon, simultaneously and separately from the icon, wherein a third indication that represents a state of health (SOH) of the secondary battery is displayed by the additional icon, and a size of the additional icon becomes smaller as the SOH decreases.

\* \* \* \* \*